US012396261B2

(12) United States Patent
Huang et al.

(10) Patent No.: US 12,396,261 B2
(45) Date of Patent: Aug. 19, 2025

(54) ELECTRONIC DEVICE

(71) Applicant: Innolux Corporation, Miaoli County (TW)

(72) Inventors: Wan-Ling Huang, Miaoli County (TW); Chun-Hsien Lin, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 344 days.

(21) Appl. No.: 17/980,533

(22) Filed: Nov. 3, 2022

(65) Prior Publication Data

US 2023/0170354 A1    Jun. 1, 2023

(30) Foreign Application Priority Data

Dec. 1, 2021 (CN) .......................... 202111454557.9

(51) Int. Cl.
  *H10D 86/60* (2025.01)
  *G09G 5/00* (2006.01)
  *H10D 86/01* (2025.01)
  *H10D 86/40* (2025.01)

(52) U.S. Cl.
  CPC .......... *H10D 86/60* (2025.01); *H10D 86/021* (2025.01); *H10D 86/441* (2025.01); *G09G 5/003* (2013.01); *G09G 2300/0426* (2013.01)

(58) Field of Classification Search
  CPC ... H01L 23/60; H01L 27/124; H01L 27/1259; G09G 2330/04; H05K 1/117; H05K 3/403; H05K 2201/09354
  See application file for complete search history.

(56) References Cited

U.S. PATENT DOCUMENTS

| | | | |
|---|---|---|---|
| 2017/0118834 A1* | 4/2017 | Pyun | H05K 1/144 |
| 2017/0261542 A1* | 9/2017 | Onishi | G01R 31/66 |
| 2017/0265297 A1* | 9/2017 | Onishi | G01R 31/28 |
| 2020/0350476 A1* | 11/2020 | Lee | G09F 9/3026 |
| 2021/0364870 A1* | 11/2021 | Chen | H05K 1/0259 |
| 2024/0055443 A1* | 2/2024 | Zheng | H10D 86/443 |

* cited by examiner

*Primary Examiner* — Nathan Milakovich
(74) *Attorney, Agent, or Firm* — JCIPRNET

(57) ABSTRACT

The disclosure provides an electronic device including a substrate, an electronic element, a driving element, a first trace, a second trace, a conductive pattern, and an electrostatic discharge protection element. The substrate includes a first surface, a second surface, and a third surface. The third surface connects to the first surface and the second surface. The electronic element is disposed on the first surface. The driving element is disposed on the second surface. The first traces are disposed on the first surface. The second traces are disposed on the second surface and are electrically connected to the driving element, and the corresponding first traces are electrically connected to the corresponding second traces. The conductive pattern is electrically connected to the driving element and receives a grounding voltage or is floating. The electrostatic discharge protection element is disposed on the first surface and is electrically connected to the driving element.

20 Claims, 14 Drawing Sheets

ELECTRONIC DEVICE

CROSS-REFERENCE TO RELATED APPLICATION

This application claims the priority benefit of China application serial no. 202111454557.9, filed on Dec. 1, 2021. The entirety of the above-mentioned patent applications is hereby incorporated by reference herein and made a part of this specification.

BACKGROUND

Technical Field

The disclosure relates to an electronic device.

Description of Related Art

With the technological advancement of modern electronic devices, the size of electronic elements is getting smaller and smaller. Even for the disposition of large-sized electronic devices, they are formed by mostly splicing multiple small-sized electronic devices. However, the insulating layer in small-sized electronic elements is also relatively thin, and when static electricity accumulated on the edge of the electronic device invades the region where the electronic elements are disposed, the small-sized electronic elements are prone to electrostatic breakdown and the electronic elements are permanently damaged. Alternatively, for other large-sized electronic elements, if the static electricity accumulated on the edge of the electronic device is large enough and invades into the region where the electronic elements are disposed, the electronic elements also suffer from the above-mentioned problem of electrostatic breakdown. Therefore, how to provide a reliable electrostatic discharge protection design in an electronic device is one of the technologies that have been vigorously developed in recent years.

SUMMARY

This disclosure provides an electronic device that may provide a reliable electrostatic discharge protection design.

According to an embodiment of this disclosure, a display device includes a substrate, an electronic element, a driving element, multiple first traces, multiple second traces, a conductive pattern, and an electrostatic discharge protection element. The substrate includes a first surface, a second surface, and a third surface. The first surface is opposite to the second surface, and the third surface is located between the first surface and the second surface and connected to the first surface and the second surface. The electronic element is disposed on the first surface. The driving element is disposed on the second surface. The first traces are disposed on the first surface. The second traces are disposed on the second surface and are electrically connected to the driving element. The corresponding first traces are electrically connected to the corresponding second traces. The conductive pattern is disposed on the third surface and is electrically connected to the driving element. The conductive pattern receives a grounding voltage from the driving element or is floating. The electrostatic discharge protection element is disposed on the first surface and is electrically connected to the driving element. A thickness of the conductive pattern is greater than or equal to 1 micron and less than or equal to 5 microns.

According to an embodiment of this disclosure, a display device includes a substrate, an electronic element, a driving element, multiple first traces, multiple second traces, and a conductive pattern. The substrate includes a first surface, a second surface, and a third surface. The first surface is opposite to the second surface, and the third surface is located between the first surface and the second surface and connected to the first surface and the second surface. The electronic element is disposed on the first surface. The driving element is disposed on the second surface. The first traces are disposed on the first surface. The second traces are disposed on the second surface and are electrically connected to the driving element. The corresponding first traces are electrically connected to the corresponding second traces. The conductive pattern is disposed on the third surface and is electrically connected to the driving element. The conductive pattern receives the grounding voltage from the driving element or is floating. At least one of the first traces and at least one of the second traces receive a grounding voltage from the driving element. A thickness of the conductive pattern is greater than or equal to 1 micron and less than or equal to 5 microns.

In order to make the aforementioned features and advantages of the disclosure comprehensible, embodiments accompanied with drawings are described in detail below.

DETAILED DESCRIPTION OF DISCLOSED EMBODIMENTS

Figure 1A:
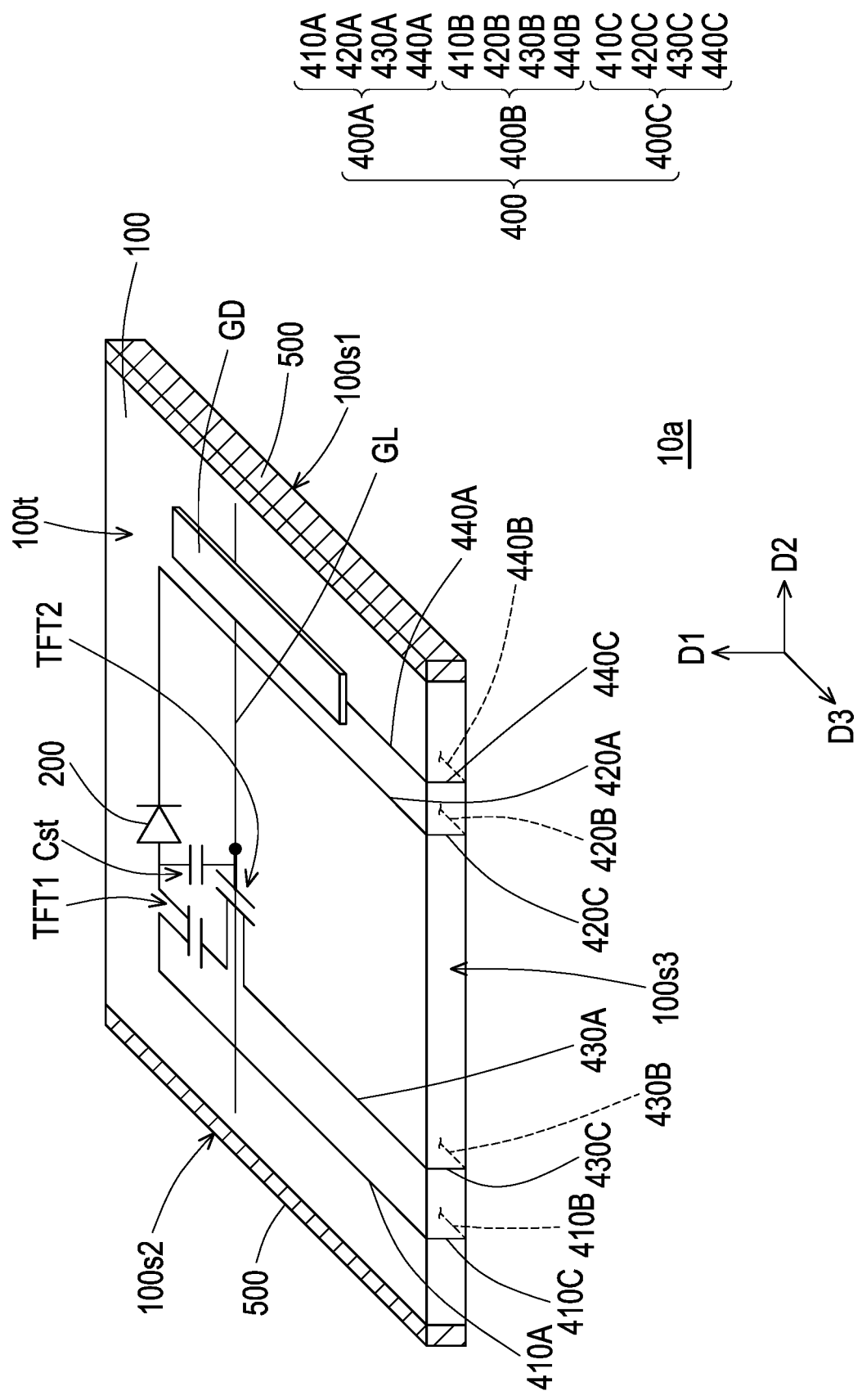
FIG. 1A and FIG. 1B are partial three-dimensional schematic views of an electronic device of the first embodiment of the disclosure.

The disclosure can be understood by referring to the following detailed description in conjunction with the accompanying drawings. It should be noted that, for the ease of understanding by the readers and for the brevity of the accompanying drawings, multiple drawings in the disclosure only depict a portion of the electronic device, and the specific elements in the drawings are not drawn according to the actual scale. In addition, the number and size of each of the elements in the figures are for illustration purposes only, and are not intended to limit the scope of the disclosure.

Certain terms may be used throughout the disclosure and the appended patent claims to refer to specific elements. It should be understood by those of ordinary skill in the art that electronic device manufacturers may refer to the same element by different names. The disclosure does not intend to distinguish between elements that have the same function but have different names. In the following description and patent claims, words such as "comprising", "including", and "having" are open-ended words, so they should be interpreted as meaning "including but not limited to . . . ". Accordingly, when the terms "comprising", "including", and/or "having" are used in the description of this disclosure, they designate the presence of the corresponding feature, region, step, operation and/or component, but do not exclude the presence of one or more of a corresponding feature, region, step, operation, and/or component.

In the disclosure, wordings used to indicate directions, such as "up," "down," "front," "back," "left," and "right," merely refer to directions in the accompanying drawings. Therefore, the directional wordings are used to illustrate rather than limit the disclosure. In the accompanying drawings, the drawings show the general features of the methods, structures, and/or materials used in the particular embodiments. However, the drawings shall not be interpreted as defining or limiting the scope or nature covered by the embodiments. For example, the relative sizes, thicknesses, and locations of the layers, regions, and/or structures may be reduced or enlarged for clarity.

When a corresponding component (e.g., a film layer or region) is referred to as being "on" another component, it can be directly on the other component or other components may be present therebetween. On the other hand, when a component is referred to as being "directly on" another member, there are no components in between. Additionally, when a component is referred to as being "on" another component, the two are in a top-down relationship when viewed from above, and the component can be above or below the other component, depending on the orientation of the device.

The terms "about", "equal to", "equal" or "same", "substantially" or "generally" are interpreted as within 20% of a given value or range, or interpreted as within 10%, 5%, 3%, 2%, 1%, or 0.5% of the given value or range.

The terms such as "first", "second", etc. used in the description and the patent claims are used to modify elements, which do not imply and represent that the (or these) elements have any previous ordinal numbers, and also does not represent the order of a certain element and another element, or the order of the manufacturing method. The use of these ordinal numbers is to only clearly distinguish an element with a certain name from another element with the same name. The same terms may not be used in the patent claims and the description, and accordingly, the first component in the description may be the second component in the patent claims.

It should be noted that, in the following embodiments, the features in several different embodiments can be replaced, reorganized, and mixed to complete other embodiments without departing from the spirit of the disclosure. As long as the features of the various embodiments do not violate the spirit of the disclosure or conflict with one another, they can be mixed and matched arbitrarily.

The electrical connection or coupling described in the disclosure can refer to direct connection or indirect connection. In the case of a direct connection, the ends of two elements on a circuit directly connect to each other, or connect to each other through a conductive wire. In the case of indirect connection, a switch, a diode, a capacitor, an inductor, other suitable elements, or a combination thereof, but not limited therein, is between the end of two elements on a circuit.

In the disclosure, the thickness, length, and width may be measured by adopting a measurement method such as an optical microscope, and the thickness can be measured from a cross-sectional image in an electronic microscope, but not limited thereto. In addition, any two values or directions used for comparison may have certain errors. If a first value is equal to a second value, it implies that there may be an error of about 10% between the first value and the second value; if a first direction is perpendicular to a second direction, an angle between the first direction and the second direction may be between 80 degrees and 100 degrees; if the first direction is parallel to the second direction, an angle between the first direction and the second direction may be between 0 degrees and 10 degrees.

The electronic device of this disclosure may include, but is not limited to, display, antenna (e.g., liquid crystal antenna), lighting, sensing, touch, splicing, other suitable functions, or a combination of the aforementioned functions. The electronic device includes, but is not limited to, a rollable or flexible electronic device. The electronic device may, for example, include liquid crystal, light emitting diode (LED), quantum dot (QD), fluorescence, phosphor, other suitable materials or the combination thereof. The light emitting diode may for example include an organic light emitting diode (OLED), a micro/mini light emitting diode (micro-LED, mini-LED) or a quantum dot light emitting diode (QLED, QDLED), but not limited thereto. Hereinafter, this disclosure is described by taking a display device or a splicing device as the electronic device, but this disclosure is not limited thereto.

Exemplary embodiments of this disclosure are exemplified below, the same reference numerals in the drawings and the descriptions indicate the same or similar parts.

Figure 1B:
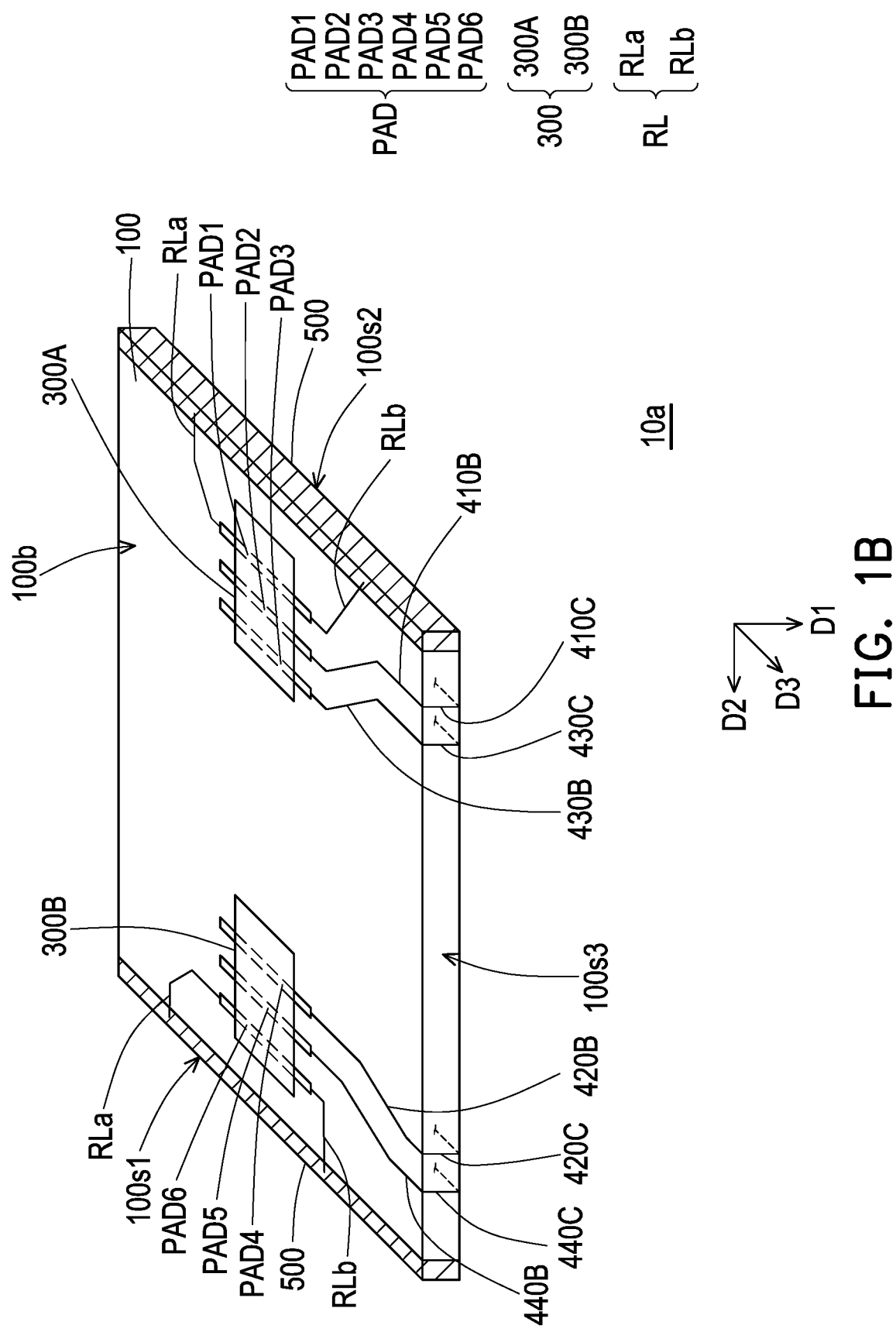

FIG. 1A and FIG. 1B are partial three-dimensional schematic views of an electronic device of the first embodiment of the disclosure. FIG. 1A is a front partial three-dimensional schematic view of the electronic device of the first embodiment of the disclosure, and FIG. 1B is a back partial three-dimensional schematic view of the electronic device of the first embodiment of the disclosure.

Referring to FIG. 1A and FIG. 1B at the same time, an electronic device 10a of this embodiment includes a substrate 100, an electronic element 200, a driving element 300, multiple first traces 400A, multiple second traces 400B, and a conductive pattern 500.

The material of the substrate 100 may be, for example, glass, plastic, or a combination thereof. For example, the material of the substrate 100 may include quartz, sapphire, polymethyl methacrylate (PMMA), polycarbonate (PC), polyimide (PI), polyethylene terephthalate (PET), or other suitable materials, or a combination thereof. In this embodiment, the material of the substrate 100 is glass, but this disclosure is not limited thereto. In some embodiments, the substrate 100 has a first surface 100t, a second surface 100b, and a third surface 100s1. The first surface 100t and the second surface 100b of the substrate 100 are, for example, opposite to each other, and have a normal direction substantially parallel to a first direction D1, for example, but the disclosure is not limited thereto. In this embodiment, the first surface 100t and the second surface 100b of the substrate 100 are the top surface and the bottom surface of the substrate 100, respectively, but this disclosure is not limited thereto. The third surface 100s1 of the substrate 100 is, for example, located between the first surface 100t and the second surface 100b, and is connected to the first surface 100t and the second surface 100b. In detail, one side of the third surface 100s1 of the substrate 100 is connected to one side of the first surface 100t, and the opposite side of the third surface 100s1 of the substrate 100 is connected to one side of the second surface 100b. In some embodiments, the normal direction of the third surface 100s1 of the substrate 100 is, for example, substantially parallel to a second direction D2, and, for example, substantially perpendicular to the first direction D1, but the disclosure is not limited thereto. In this embodiment, the third surface 100s1 of the substrate 100 is the first side surface of the substrate 100, but this disclosure is not limited thereto.

In other embodiments, the substrate 100 further has a fourth surface 100s2. The fourth surface 100s2 of the substrate 100 is opposite to the third surface 100s1 and is also connected to the first surface 100t and the second surface 100b. In detail, one side of the fourth surface 100s2 of the substrate 100 is connected to one side of the first surface 100t, and the opposite side of the fourth surface 100s2 of the substrate 100 is connected to one side of the second surface 100b. In some embodiments, the normal direction of the fourth surface 100s2 of the substrate 100 is, for example, substantially parallel to a second direction D2, and, for example, substantially perpendicular to the first direction D1, but the disclosure is not limited thereto. In this embodiment, the fourth surface 100s2 of the substrate 100 is the second side surface of the substrate 100, but this disclosure is not limited thereto.

In other embodiments, the substrate 100 further has a fifth surface 100s3. The fifth surface 100s3 of the substrate 100 is adjacent to the third surface 100s1 and the fourth surface 100s2, and is also connected to the first surface 100t and the second surface 100b. In detail, one side of the fifth surface 100s3 of the substrate 100 is connected to one side of the first surface 100t, and the opposite side of the fifth surface 100s3 of the substrate 100 is connected to one side of the second surface 100b. In some embodiments, the normal direction of the fifth surface 100s3 of the substrate 100 is, for example, substantially parallel to a third direction D3, and, for example, substantially perpendicular to the first direction D1 and the second direction D2, but this disclosure is not limited thereto. In some embodiments, the fifth surface 100s3 is, for example, connected to the third surface 100s1 and the fourth surface 100s2. In this embodiment, the fifth surface 100s3 of the substrate 100 is the third side surface of the substrate 100, but this disclosure is not limited thereto.

The electronic element 200 is disposed on, for example, the first surface 100t of the substrate 100. It should be noted here that although FIG. 1A shows the disposition of one electronic element, this disclosure is not limited thereto, that is, there may be multiple electronic elements 200. For example, the electronic elements 200 may be arranged on the first surface 100t of the substrate 100 in an array arrangement, a staggered arrangement (e.g., in a pentile manner) or other manners, but this disclosure is not limited thereto. In this embodiment, the electronic element 200 includes multiple light emitting elements, which may emit light of various suitable colors (e.g., blue light) or UV light, but this disclosure is not limited thereto. In some embodiments, the electronic elements 200 may include self-luminous materials. For example, the electronic element 200 may include a organic light emitting diode (OLED), an inorganic light emitting diode (LED), such as a mini light emitting diode (mini LED) or a micro light emitting diode (micro LED), a quantum dot (QD), a quantum dot light emitting diode (QLED, QDLED), fluorescence, phosphor, other suitable materials, or a combination thereof, but this disclosure is not limited thereto, and the size of the electronic element 200 may be adjusted according to requirements. In other embodiments, the electronic element 200 may include non-self-luminous materials, such as liquid crystal molecules, electrophoretic display medium, or other applicable medium. The liquid crystal molecules are liquid crystal molecules that may be rotated or switched by a vertical electric field or liquid crystal molecules that may be rotated or switched by a transverse electric field, but the disclosure is not limited to this. In some embodiments, the electronic device 10a of this embodiment may optionally include a filling layer (not shown). For example, the filling layer is disposed on the first surface 100t of the substrate 100 and covers the electronic element 200. For example, in addition to being disposed above the electronic element 200, the filling layer is also disposed adjacent to or surrounding the electronic element 200. Thus, the filling layer may be used, for example, to fix or protect the electronic element 200. In some embodiments, the fill layer includes a transparent material. For example, the material of the filling layer may include epoxy, acrylic, other suitable materials, or a combination thereof. In some embodiments, the filling layer may include a single-layer structure or a composite-layer structure, but this disclosure is not limited thereto. In addition, the electronic device 10a may, for example, optionally further include a functional layer (not shown), in which the functional layer, for example, covers the above-mentioned filling layer. In some embodiments, the functional layer may, for example, have a high surface hardness. For example, the functional layer may include, for example, a hard coat layer with a pencil hardness greater than 5H, so as to protect components such as the electronic element 200 from being scratched or damaged. In addition, the functional layer may also have functions such as anti-glare or reducing chromatic aberration. For example, the functional layer may include multiple anti-glare structures or optical matching layers. The anti-glare structure may be used, for example, to sufficiently scatter the incident ambient light, so as to prevent most of the ambient light from entering the electronic device 10a and affecting the display screen thereof, thereby having anti-glare capability. In addition, the optical matching layer may, for example, include multiple film layers with different refractive indices, which may be used to avoid the problem that components such as the electronic element 200 interfere with the display of the electronic device 10a under the irradiation of ambient light. It is worth noting here that, although the electronic element 200 includes multiple light emitting elements as an example for the disclosure, it does not mean that the present application may only be applied to the electronic device 10a including multiple light emitting elements, that is, the electronic device 10a of the present application may also be an electronic device such as an antenna device, a sensing device, or a splicing device. For example, the electronic device 10a may include active elements, passive elements, or combinations thereof, which may include diodes, transistors, capacitors, inductors, resistors, or combinations thereof, but the disclosure is not limited thereto.

The driving element 300 is, for example, disposed on the second surface 100b of the substrate 100. In some embodiments, the driving element 300 is disposed on the second surface 100b of the substrate 100 in a chip on glass (COG) manner, but this disclosure is not limited thereto. That is, in some other embodiments, the driving element 300 may be disposed on the second surface 100b of the substrate 100 in a chip on plastic (COP) manner. In this embodiment, two driving elements 300 (a driving element 300A and a driving element 300B) are disposed on the second surface 100b of the substrate 100, but the disclosure is not limited thereto. In addition, in this embodiment, the electronic device 10a further includes multiple pads PAD disposed on the second surface 100b of the substrate 100. It is worth noting here that, although only the pads PAD including pad PAD1, pad PAD2, pad PAD3, pad PAD4, pad PAD5, and pad PAD6 are shown in this embodiment, but this disclosure is not limited thereto. The driving element 300A and the driving element 300B may include, for example, a driving chip, a circuit board, or a combination thereof. In some embodiments, the driving chip may include driving units such as a timing control unit, a data driving unit, and a power driving unit, and the circuit board may include a flexible printed circuit board (FPC), but the disclosure is not limited thereto. In this embodiment, the driving element 300A is bonded with the pad PAD1, the pad PAD2, and the pad PAD3, and the driving element 300B is connected to the pads the pad PAD4, the pad PAD5, and the pad PAD6, but the disclosure is not limited thereto.

The first traces 400A and the second traces 400B are, for example, respectively disposed on the first surface 100t and the second surface 100b of the substrate 100 and are electrically connected to the driving element 300. In detail, the first traces 400A are disposed on the first surface 100t of the substrate 100, and the second traces 400B are disposed on the second surface 100b of the substrate 100. The corresponding second traces 400B are respectively connected to the corresponding pads PAD, that is, the corresponding second traces 400B in this embodiment are respectively connected to the pad PAD1, the pad PAD2, the pad PAD3, the pad PAD4, the pad PAD5, and the pad PAD6. In this embodiment, the electronic device 10a further includes multiple third traces 400C disposed on the fifth surface 100s3 of the substrate 100. The corresponding first traces 400A and the corresponding second traces 400B are electrically connected to each other through the third traces 400C disposed on the fifth surface 100s3 of the substrate 100. In detail, one end of the third trace 400C disposed on the fifth surface 100s3 of the substrate 100 may be connected to one of the first traces 400A, and the other end of the third trace 400C disposed on the fifth surface 100s3 of the substrate 100 may be connected to one of the second traces 400B, so that the corresponding first trace 400A and the corresponding second trace 400B may be electrically connected to each other. From another perspective, the corresponding first trace 400A, the second trace 400B, and the third trace 400C are, for example, combined into a trace 400. Each of the traces 400 has different functions according to the component it is connected to, which is described in detail in the following embodiments.

In this embodiment, when the electronic element 200 includes multiple light emitting elements, the traces 400 may include a first power supply line 410 (including a first power supply line 410A, a first power supply line 410B, and a first power supply line 410C), a second power supply line 420 (including the second power supply line 420A, the second power supply line 420B, and the second power supply line 420C), a data line 430 (including a data line 430A, a data line 430B, and a data line 430C) and a working signal line 440 (including a working signal line 440A, a working signal line 440B, and a working signal line 440C). The first power supply line 410, the second power supply line 420, the data line 430, and the working signal line 440 are respectively connected to the pad PAD2, the pad PAD4, the pad PAD3, and the pad PAD5. From another perspective, in this embodiment, the first trace 400A disposed on the first surface 100t of the substrate 100 includes the first power supply line 410A, the second power supply line 420A, the data line 430A, and the working signal line 440A. The second trace 400B disposed on the second surface 100b of the substrate 100 includes the first power supply line 410B, the second power supply line 420B, the data line 430B, and the working signal line 440B. The third trace 400C disposed on the third surface 100s1 of the substrate 100 includes the first power supply line 410C, the second power supply line 420C, the data line 430C, and the working signal line 440C. The electronic element 200 may be supplied with an anode power supply potential, for example, through the first power supply line 410, and may be supplied with a cathode power supply potential, for example, through the second power supply line 420. The anode power supply potential is a power supply potential higher than the cathode power supply potential, so that the electronic element 200 may supply forward current through the potential difference between the anode power supply potential and the cathode power supply potential to emit light. In this embodiment, the electronic device 10a further includes a first transistor TFT1, a second transistor TFT2, a gate driver GD, and a storage capacitor Cst disposed on the first surface 100t of the substrate 100. The source of the first transistor TFT1 is, for example, connected to the electronic element 200, and the drain of the first transistor TFT1 is, for example, connected to the first power supply line 410. The first transistor TFT1 may, for example, be used as a switching element that drives the electronic element 200. The source of the second transistor TFT2 is, for example, connected to the data line 430, the drain of the second transistor TFT2 is, for example, connected to the gate of the first transistor TFT1, and the gate of the second transistor TFT2 is connected to a gate line GL. The second transistor TFT2 may, for example, be used as a switching element that drives a pixel unit (not shown). The gate driver GD is, for example, connected to the gate line GL and driven through the working signal line 440, and may transmit the corresponding gate signal to the pixel unit (not shown) through the gate line GL, so as to turn on the active element (e.g., the second transistor TFT2) in the corresponding pixel unit. The working signal line 440 may, for example, at least include a clock signal line, but this disclosure is not limited thereto. For example, the two ends of the storage capacitor Cst are respectively coupled to the source of the first transistor TFT1 and the gate of the second transistor TFT2. One end of the storage capacitor Cst may, for example, receive the power supply voltage through the first transistor TFT1, and the other end of the storage capacitor Cst may, for example, receive the data voltage through the second transistor TFT2. It should be noted here that the above-mentioned components that the electronic device 10a may further include is an example in which the electronic element 200 includes multiple light emitting elements. It should be noted that the electronic device protected by this disclosure is not limited to including the above-mentioned components. In addition, although the first power supply line 410, the second power supply line 420, the data line 430, and the working signal line 440 are shown as one line in FIG. 1A and FIG. 1B, this disclosure is not limited thereto, that is, the electronic device 10a may include multiple first power supply lines 410, multiple second power supply lines 420, multiple data lines 430, and multiple working signal lines 440. Furthermore, the traces 400 may also include other traces having other functions, and this disclosure is not limited thereto.

The conductive pattern 500 may be disposed on at least one side surface of the substrate 100, for example. In this embodiment, the conductive pattern 500 is disposed on the third surface 100s1 of the substrate 100. The conductive pattern 500 may be formed on the third surface 100s1 of the substrate 100 by, for example, performing a laser process. In detail, in some embodiments, a conductive pattern material layer (not shown) may be formed on at least the third surface 100s1 of the substrate 100 by sputtering (or thermal evaporation or atomic layer deposition). After that, a laser process is performed on the conductive pattern material layer to form the conductive pattern 500, but it should be noted that this disclosure is not limited thereto. In other embodiments, the conductive pattern 500 may be formed on the third surface 100s1 of the substrate 100 by performing a printing process. The material of the formed conductive pattern 500 may include, for example, materials with low impedance such as silver, copper, gold, aluminum, tin, nickel or a combination thereof. However, the material of the conductive pattern 500 may also be, for example, other suitable materials or a combination thereof, and this disclosure is not limited thereto. In some embodiments, the conductive pattern 500 is electrically connected to the driving element 300. For example, the conductive pattern 500 and the driving element 300 may be electrically connected to each other through a reference voltage line RL, so as to play the role of electrostatic discharge protection. In detail, the reference voltage line RL is disposed on the second surface 100b of the substrate 100 and may include, for example, a reference voltage line RLa and a reference voltage line RLb. The two ends of the reference voltage line RLa are respectively connected to one end of the pad PAD6 and the conductive pattern 500, and the two ends of the reference voltage line RLb are respectively connected to the other end of the pad PAD6 and the conductive pattern 500. The reference voltage line RL may be applied to a grounding voltage (e.g., a voltage of 0V), for example, through the driving element 300, and a relatively low impedance current path is created through its electrical connection with the conductive pattern 500. Based on this, when static electricity accumulates to the edge of the electronic device (e.g., near the junction between the first surface 100t and the third surface 100s1 of the substrate 100 and/or the junction between the second surface 100b and the third surface 100s1 of the substrate 100), the static electricity may be dissipated through the current path generated by the reference voltage line RL and the conductive pattern 500, thereby preventing the static electricity from intruding into the region where the electronic element 200 is disposed in the electronic device 10a, so as to play the role of electrostatic discharge protection. However, this disclosure is not limited thereto, and in other embodiments, the conductive pattern 500 may be floating. In some embodiments, the conductive pattern 500 has a thickness greater than or equal to 1 micron and less than or equal to 5 microns (1 micron≤the thickness of the conductive pattern 500≤5 microns). In detail, the thickness of the conductive pattern 500 in the second direction D2 is greater than or equal to 1 micron and less than or equal to 5 microns (1 micron≤the thickness of the conductive pattern 500≤5 microns).

In this embodiment, the conductive pattern 500 may be, for example, further disposed on the fourth surface 100s2 of the substrate 100. The process of disposing the conductive pattern 500 on the fourth surface 100s2 of the substrate 100 and the materials included therein may be referred to the foregoing embodiments, and details are not described herein again. In addition, the conductive pattern 500 disposed on the fourth surface 100s2 of the substrate 100 may also be electrically connected to the reference voltage line RL to receive the grounding voltage from the driving element 300 (the reference voltage line RL is connected to the pad PAD1, and the connection method may be referred to the foregoing embodiment, which is not be repeated herein). Thereby, another relatively low impedance current path is created, for example, near the junction of the first surface 100t and the fourth surface 100s2 of the substrate 100 and/or the junction of the second surface 100b and the fourth surface 100s2 of the substrate 100, so as to play the role of electrostatic discharge protection. In addition, for the disposition of the conductive pattern 500, this disclosure provides multiple first traces 400A and multiple second traces 400B with the aforementioned designs, which may maintain the stability of the transmitted signals. In this embodiment, the conductive pattern 500 uniformly covers the third surface 100s1 and the fourth surface 100s2 of the substrate 100, but this disclosure is not limited thereto. In other embodiments, a portion of the third surface 100s1 and the fourth surface 100s2 of the substrate 100 may not be covered by the conductive pattern 500.

Figure 2A:
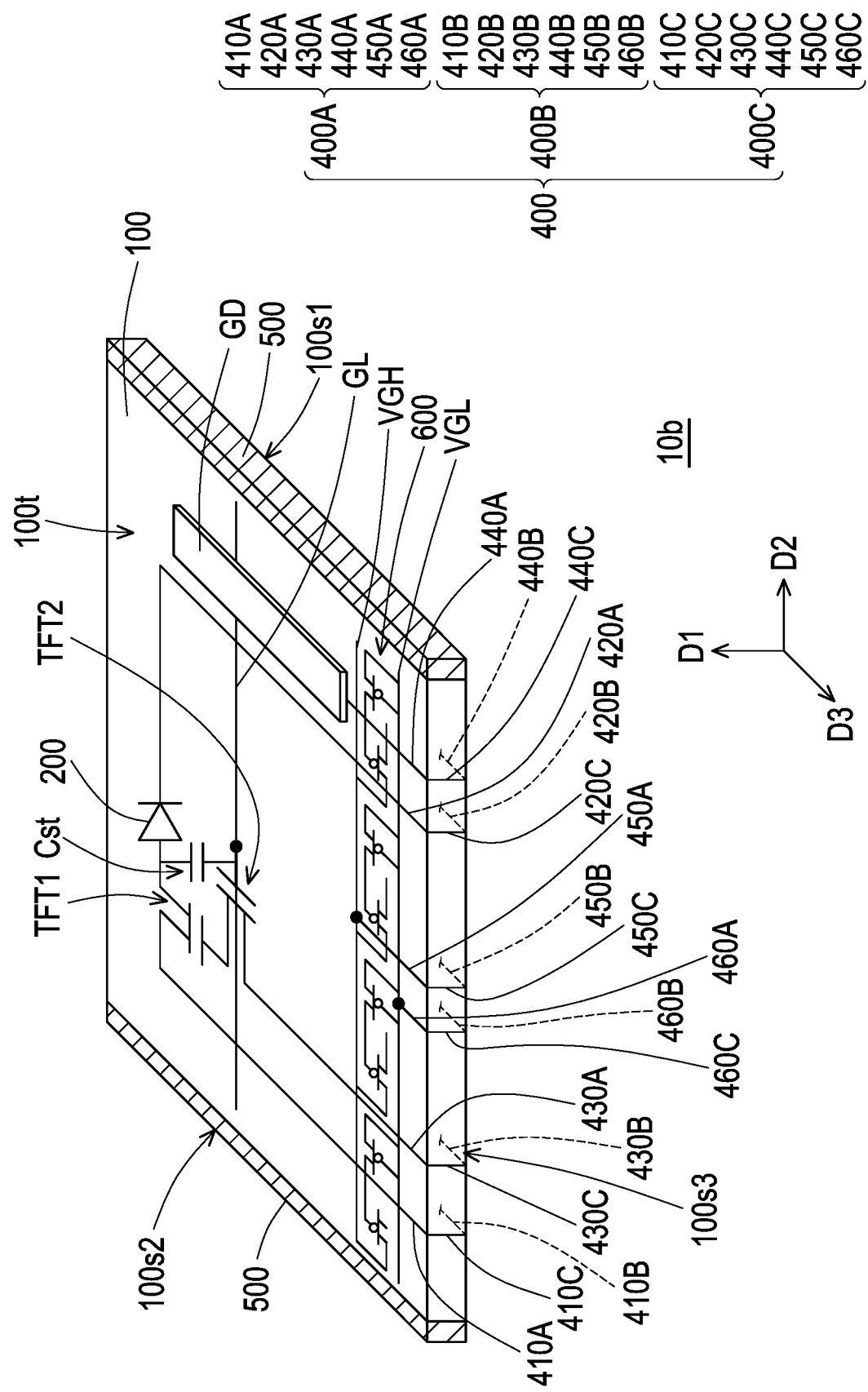
FIG. 2A and FIG. 2B are partial three-dimensional schematic views of an electronic device of the second embodiment of the disclosure.
Figure 2B:
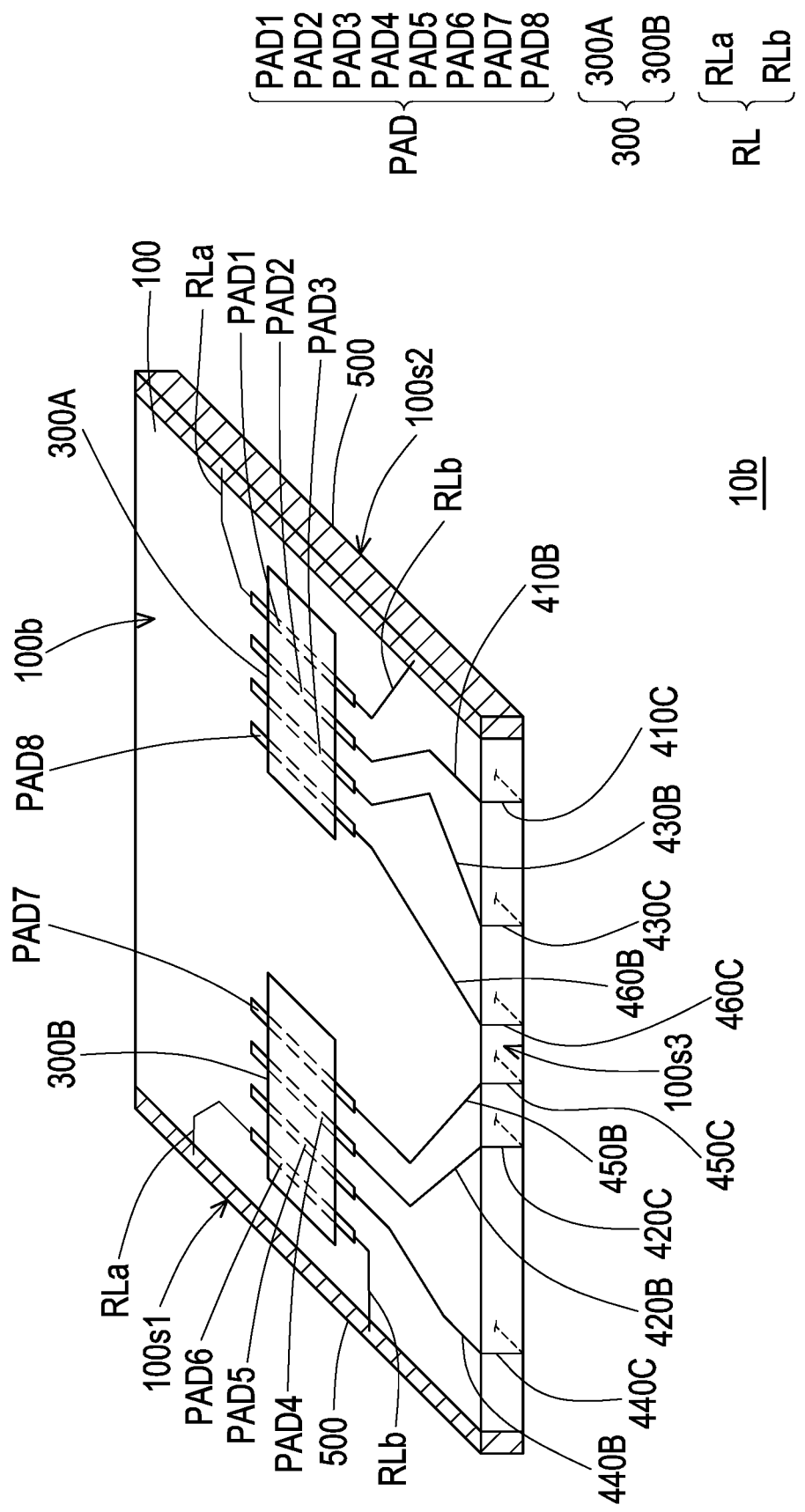
Figure 2B:
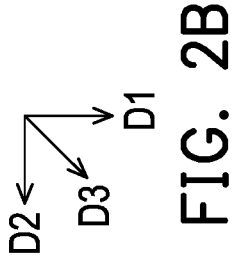

FIG. 2A and FIG. 2B are partial three-dimensional schematic views of an electronic device of the second embodiment of the disclosure. FIG. 2A is a front partial three-dimensional schematic view of the electronic device of the second embodiment of the disclosure, and FIG. 2B is a back partial three-dimensional schematic view of the electronic device of the second embodiment of the disclosure. It is noted that the embodiment of FIG. 2A and FIG. 2B may respectively use the reference numerals and a part of the contents of the embodiment of FIG. 1A and FIG. 1B, and the same or similar reference numerals are used to denote the same or similar elements, and the description of the same technical content is omitted.

Referring to FIG. 2A and FIG. 2B at the same time, the main difference between an electronic device 10b of this embodiment and the aforementioned electronic device 10a is that the electronic device 10b further includes an electrostatic discharge protection element 600. In this embodiment, the electrostatic discharge protection element 600 is disposed on the first surface 100t of the substrate 100 and is electrically connected to the driving element 300. The electrostatic discharge protection element 600 may be, for example, an electrostatic discharge protection element composed of diodes, capacitors, or a combination thereof, but this disclosure is not limited thereto. In this embodiment, the electrostatic discharge protection element 600 includes a diode-connected transistor formed by multiple diodes, but this disclosure is not limited thereto. In addition, in this embodiment, the electrostatic discharge protection element 600 is coupled between a first power supply end VGH and a second power supply end VGL. The first power end VGH and the second power end VGL are respectively used for providing the highest voltage and the lowest voltage required for the operation of the internal circuit of the electrostatic discharge protection element 600, but the disclosure is not limited thereto. In this embodiment, the traces 400 further include a third power supply line 450 (including a third power supply line 450A, a third power supply line 450B, and a third power supply line 450C) and a fourth power supply line 460 (including a fourth power supply line 460A, a fourth power supply line 460B, and a fourth power supply line 460C). The third power supply line 450 and the fourth power supply line 460 are respectively connected to the pad PAD7 and the pad PAD5. From another perspective, in this embodiment, the first trace 400A disposed on the first surface 100t of the substrate 100 further includes the third power supply line 450A and the fourth power supply line 460A, the second trace 400B disposed on the second surface 100b of the substrate 100 further includes the third power supply line 450B and the fourth power supply line 460B, and the third trace 400C disposed on the third surface 100s1 of the substrate 100 further includes the third power supply line 450C and the fourth power supply line 460C. Therefore, the electrostatic discharge protection element 600 may be supplied with corresponding power supply potentials, for example, through the third power supply line 450 and the fourth power supply line 460. The electrostatic discharge protection element 600 included in the electronic device 10b of this embodiment may also provide a relatively low impedance current path, so as to play the role of electrostatic discharge protection.

Figure 3A:
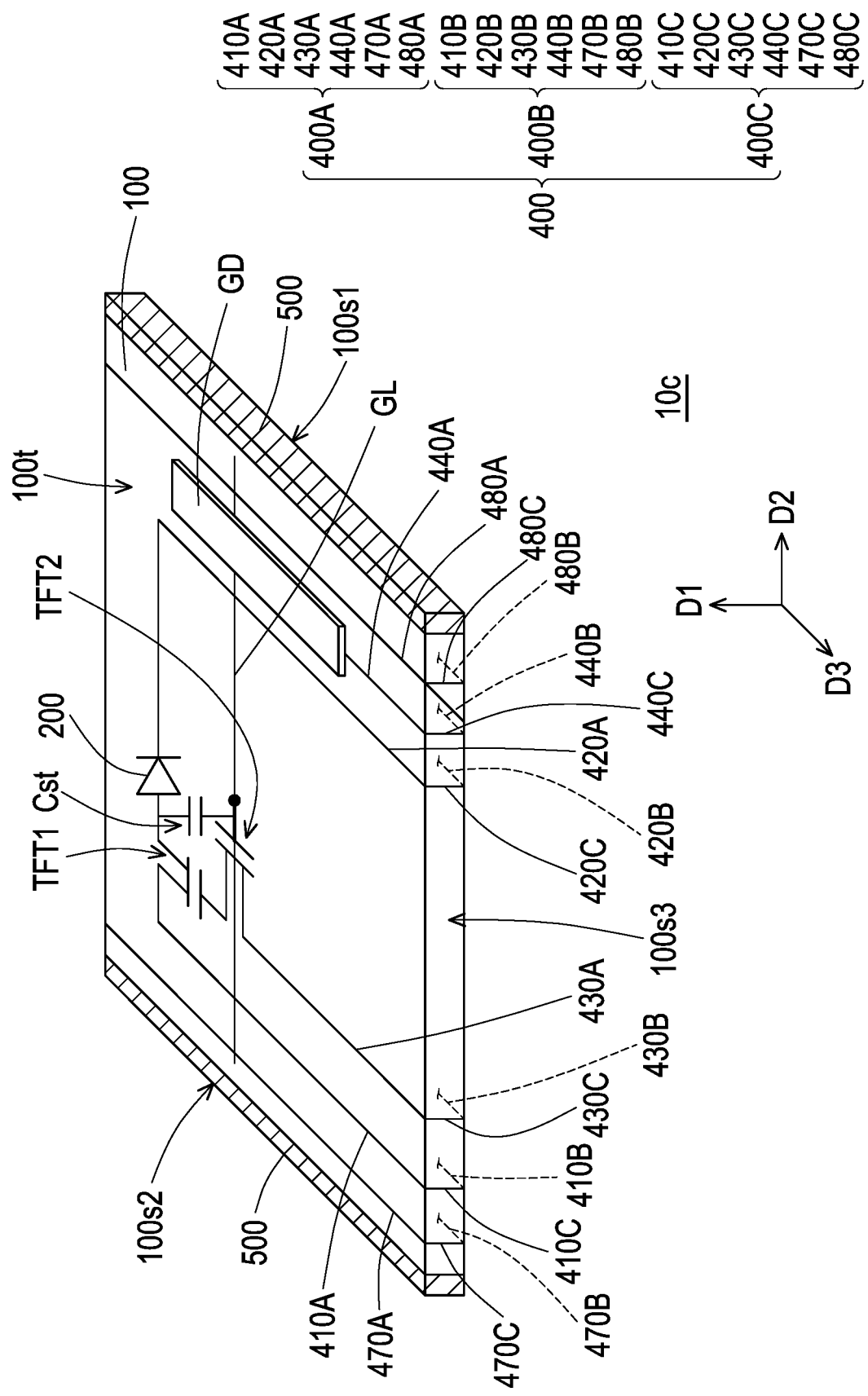
FIG. 3A and FIG. 3B are partial three-dimensional schematic views of an electronic device of the third embodiment of the disclosure.
Figure 3B:
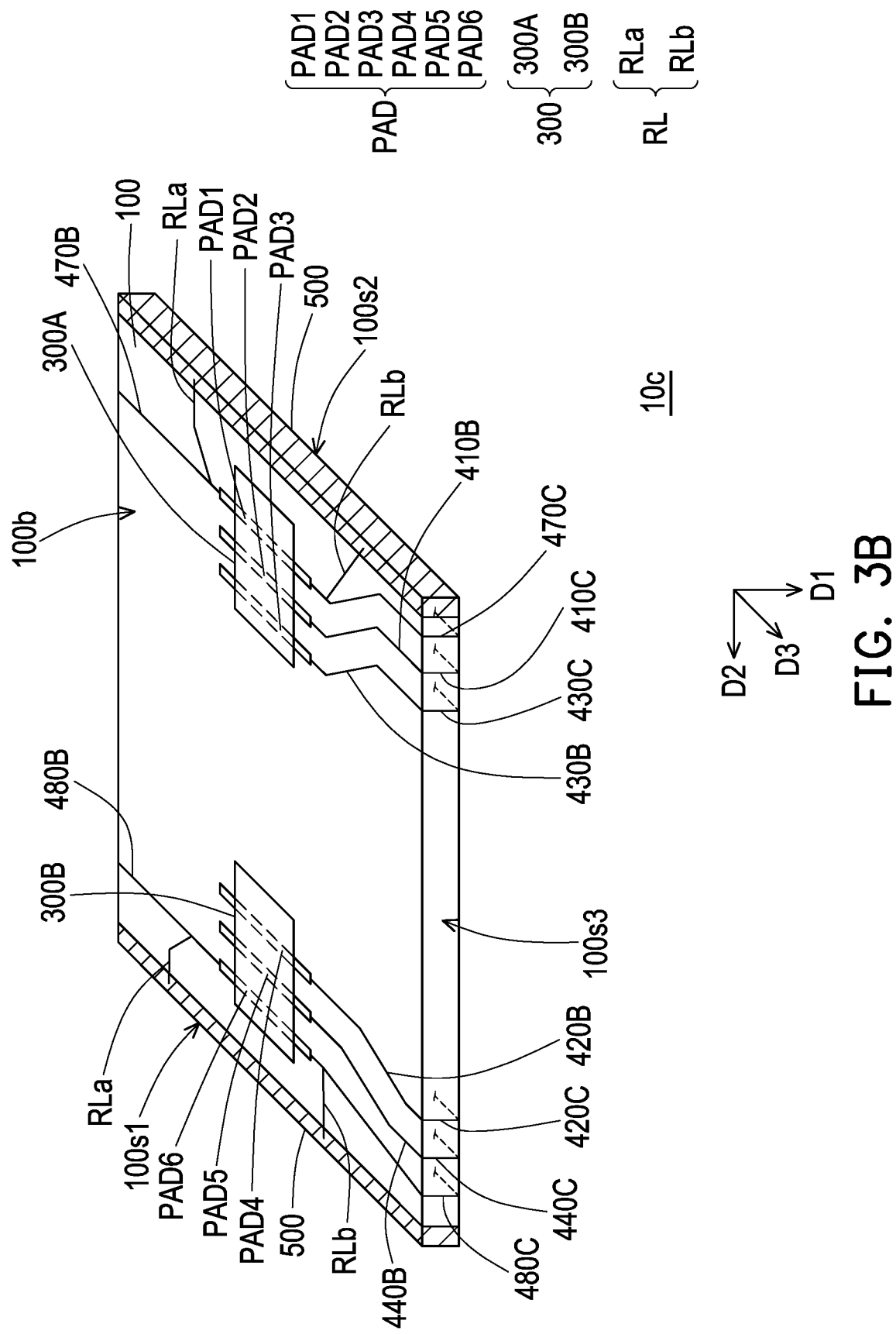

FIG. 3A and FIG. 3B are partial three-dimensional schematic views of an electronic device of the third embodiment of the disclosure. FIG. 3A is a front partial three-dimensional schematic view of the electronic device of the third embodiment of the disclosure, and FIG. 3B is a back partial three-dimensional schematic view of the electronic device of the third embodiment of the disclosure. It is noted that the embodiment of FIG. 3A and FIG. 3B may respectively use the reference numerals and a part of the contents of the embodiment of FIG. 1A and FIG. 1B, and the same or similar reference numerals are used to denote the same or similar elements, and the description of the same technical content is omitted.

3A and 3B at the same time, Referring to FIG. 3A and FIG. 3B at the same time, the main difference between an electronic device 10c of this embodiment and the aforementioned electronic device 10a is that the multiple traces 400 in the electronic device 10c further include a first grounding line 470 and a second grounding line 480. In detail, when the electronic element 200 includes multiple light emitting elements, the traces 400 not only include the first power supply line 410, the second power supply line 420, the data line 430, and the working signal line 440, it also include the first grounding line 470 (including a first grounding line 470A, a first grounding line 470B, and a first grounding line 470C) and the second grounding line 480 (including a second grounding line 480A, a second grounding line 480B, and a second grounding line 480C). The first grounding line 470 and the second grounding line 480 are respectively connected to the pad PAD1 and the pad PAD6. From another perspective, in this embodiment, the first trace 400A disposed on the first surface 100t of the substrate 100 further includes the first grounding line 470A and the second grounding line 480A, the second trace 400B disposed on the second surface 100b further includes a first grounding line 470B and a second grounding line 480B, and the third trace 400C disposed on the third surface 100s1 of the substrate 100 further includes a first grounding line 470C and a second grounding line 480C. Based on this, in some embodiments, the conductive pattern 500, the first grounding line 470, and the second grounding line 480 may be electrically connected to each other through the reference voltage line RL, so as to play the role of electrostatic discharge protection. In detail, the first grounding line 470 and the second grounding line 480 may be applied with a grounding voltage (e.g., a voltage of 0V) through the driving element 300, and a relatively low impedance current path is created by the electrically connected relationship between the first grounding line 470 and the second grounding line 480 with the conductive pattern 500. Based on this, when static electricity is generated from the region where the electronic elements 200 are disposed in the electronic device 10c, the static electricity may be dissipated through the current path generated by the first grounding line 470 and/or the second grounding line 480 and the conductive pattern 500, thereby the electrostatic breakdown of the electronic element 200 is avoided, so as to play the role of electrostatic discharge protection. In addition, although the first grounding line 470 and the second grounding line 480 are shown as one line in FIG. 3A and FIG. 3B, this disclosure is not limited thereto, that is, the electronic device 10c may include multiple first grounding lines 470 and multiple second grounding lines 480.

Figure 4A:
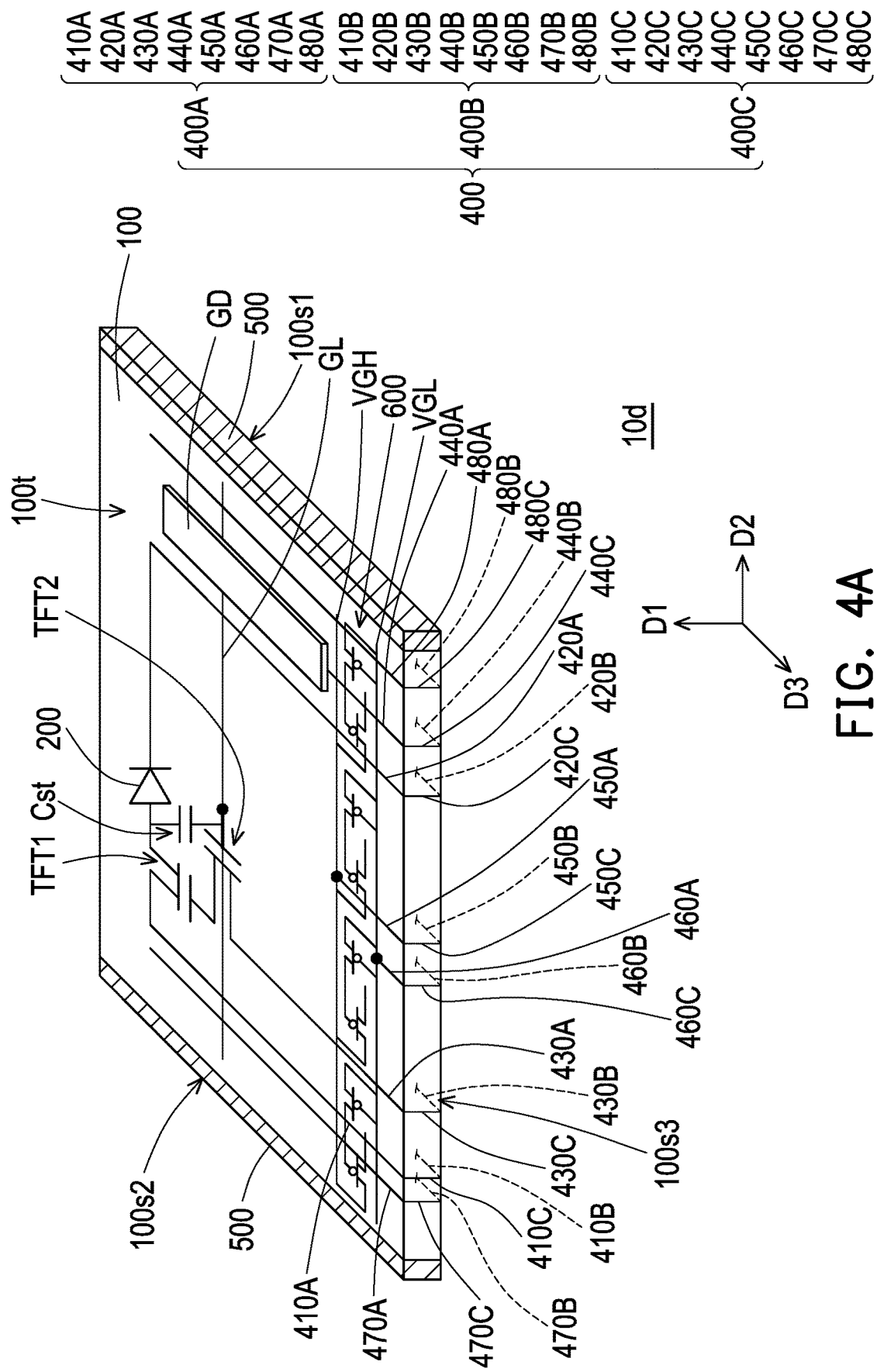
FIG. 4A and FIG. 4B are partial three-dimensional schematic views of an electronic device of the fourth embodiment of the disclosure.
Figure 4B:
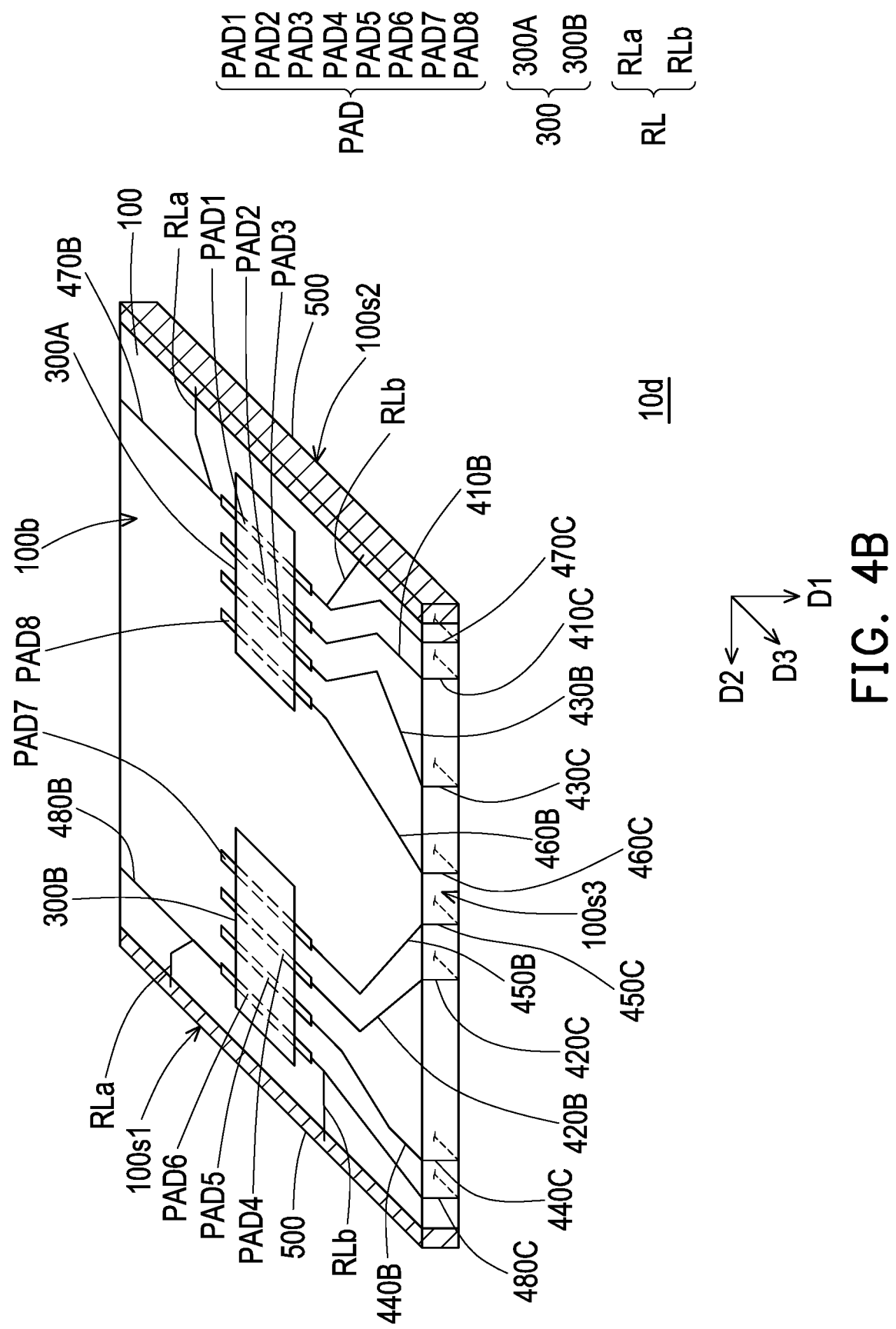

FIG. 4A and FIG. 4B are partial three-dimensional schematic views of an electronic device of the fourth embodiment of the disclosure. FIG. 4A is a front partial three-dimensional schematic view of the electronic device of the fourth embodiment of the disclosure, and FIG. 4B is a back partial three-dimensional schematic view of the electronic device of the fourth embodiment of the disclosure. It is noted that the embodiment of FIG. 4A and FIG. 4B may respectively use the reference numerals and a part of the contents of the embodiment of FIG. 2A and FIG. 2B, and the same or similar reference numerals are used to denote the same or similar elements, and the description of the same technical content is omitted.

Referring to FIG. 4A and FIG. 4B at the same time, the main difference between an electronic device 10d of this embodiment and the aforementioned electronic device 10b is that the electronic device 10d further includes an electrostatic discharge protection element 600, and the traces 400 in the electronic device 10d also include the first grounding line 470 and the second grounding line 480. The disposition relationship and the functions of the electrostatic discharge protection element 600, the first grounding line 470, and the second grounding line 480 may be referred to the foregoing embodiments, and details are not repeated herein.

Figure 5A:
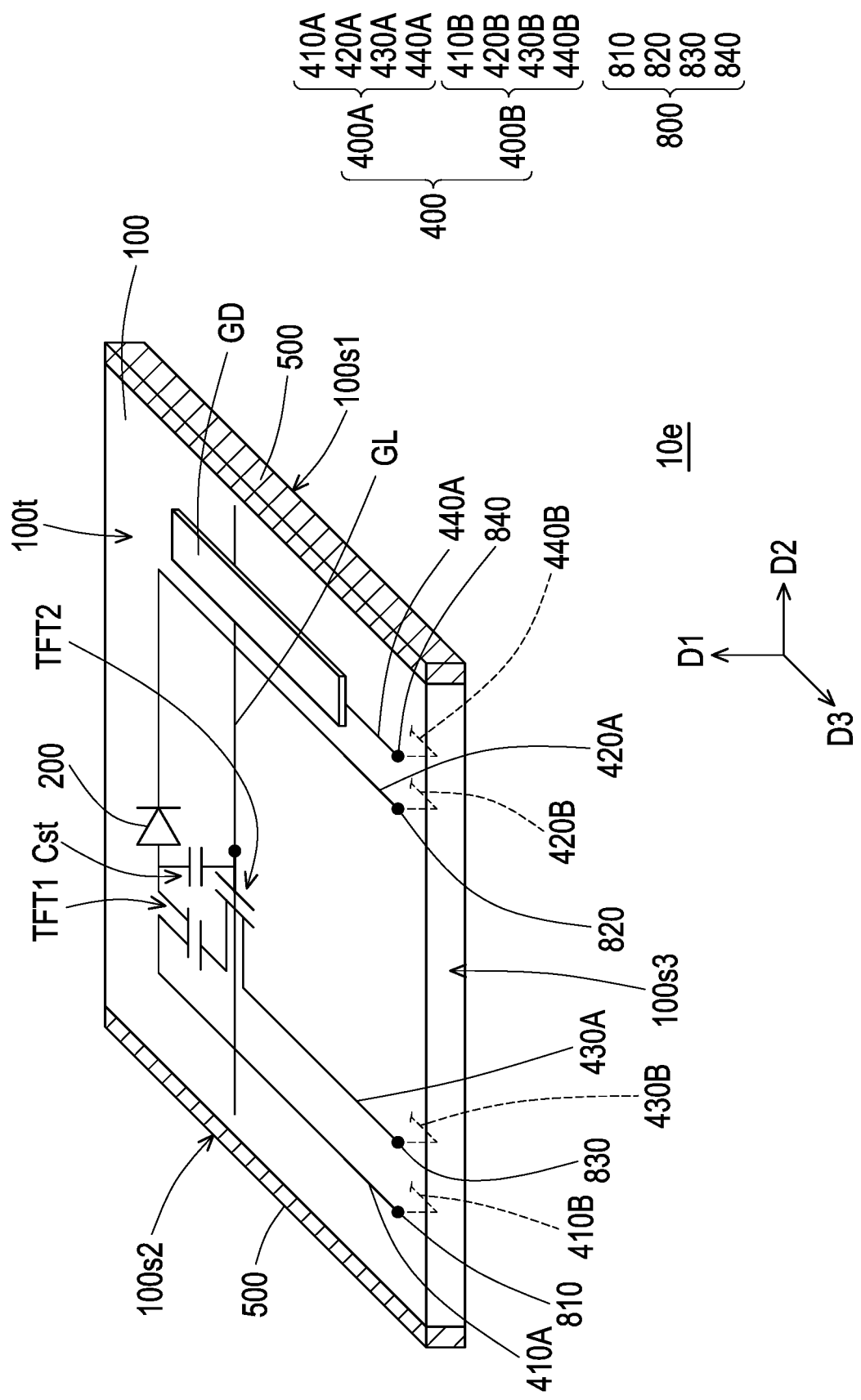
FIG. 5A and FIG. 5B are partial three-dimensional schematic views of an electronic device of the fifth embodiment of the disclosure.
Figure 5B:
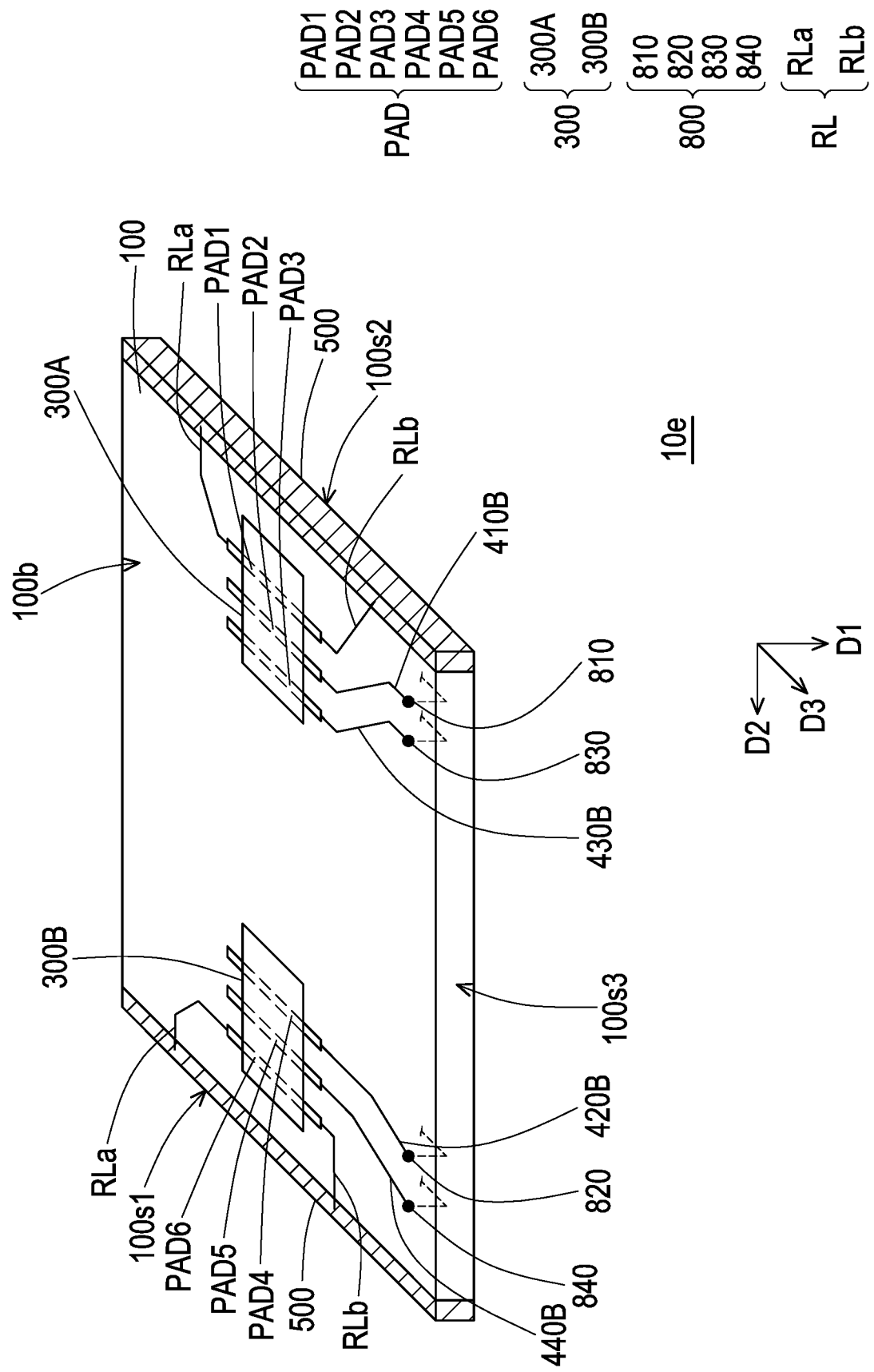

FIG. 5A and FIG. 5B are partial three-dimensional schematic views of an electronic device of the fifth embodiment of the disclosure. FIG. 5A is a front partial three-dimensional schematic view of the electronic device of the fifth embodiment of the disclosure, and FIG. 5B is a back partial three-dimensional schematic view of the electronic device of the fifth embodiment of the disclosure. It is noted that the embodiment of FIG. 5A and FIG. 5B may respectively use the reference numerals and a part of the contents of the embodiment of FIG. 1A and FIG. 1B, and the same or similar reference numerals are used to denote the same or similar elements, and the description of the same technical content is omitted.

Referring to FIG. 5A and FIG. 5B at the same time, the main difference between an electronic device 10e of this embodiment and the aforementioned electronic device 10a is that the corresponding first trace 400A and the corresponding second trace 400B are electrically connected to each other through a through hole 800 of the substrate 100. Specifically, the electronic device 10e may not include the third trace 400C; on the other hand, the electronic device 10e includes multiple through holes 800 electrically connected to one end of the first trace 400A and one end of the second trace 400B, and the through holes 800 are filled with a conductive layer (not shown), so that the corresponding first trace 400A and the corresponding second trace 400B may be electrically connected to each other. For example, in this embodiment, the through hole 800 includes a through hole 810, a through hole 820, a through hole 830, and a through hole 840. The first power supply line 410A and the first power supply line 410B are electrically connected to each other through the through hole 810, the second power supply line 420A and the second power supply line 420B are electrically connected to each other through the through hole 820, the data line 430A and the data line 430B are electrically connected to each other through the through hole 830, and the working signal line 440A and the working signal line 440B are electrically connected to each other through the through hole 840. It should be noted here that the through hole 800 of this embodiment may also be selectively applied to the electronic device 10b of the second embodiment, the electronic device 10c of the third embodiment, and the electronic device 10d of the fourth embodiment to provide another way in which the first trace 400A and the second trace 400B are electrically connected to each other. In this embodiment, the material of the substrate 100 includes glass, so the through hole 800 is a through glass via (TGV), but this disclosure is not limited to this.

Figure 6A:
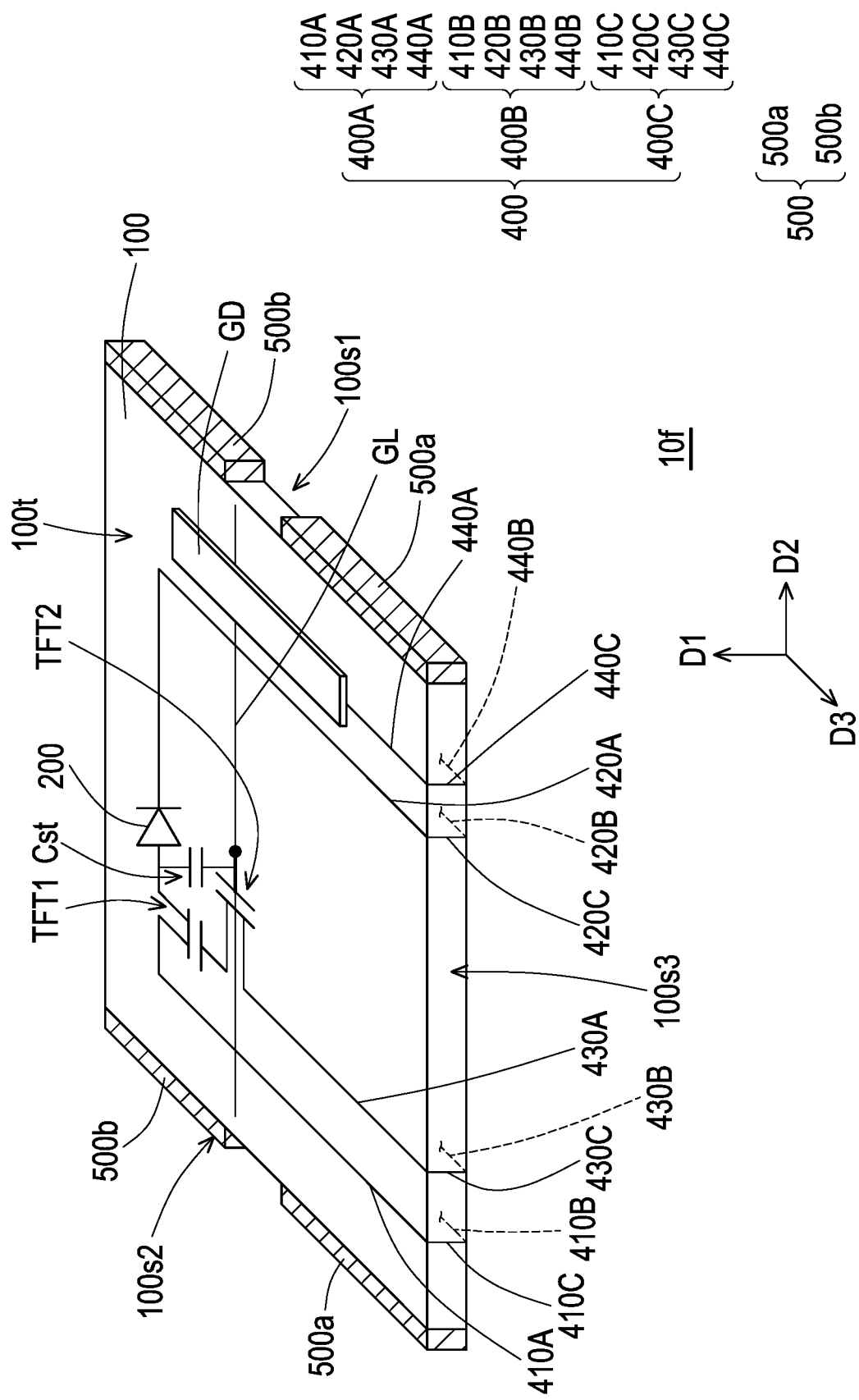
FIG. 6A and FIG. 6B are partial three-dimensional schematic views of an electronic device of the sixth embodiment of the disclosure.
Figure 6B:
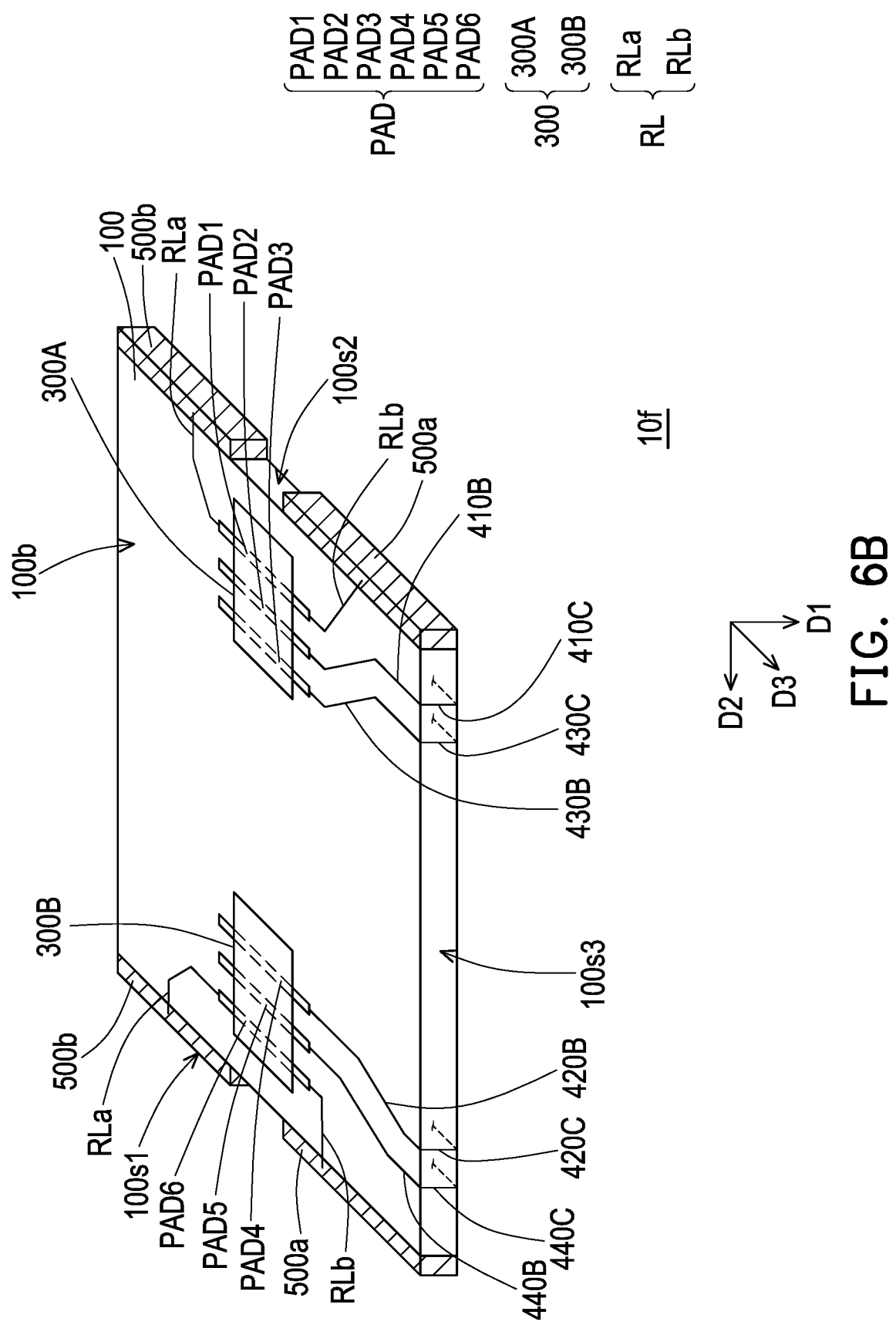

FIG. 6A and FIG. 6B are partial three-dimensional schematic views of an electronic device of the sixth embodiment of the disclosure. FIG. 6A is a front partial three-dimensional schematic view of the electronic device of the sixth embodiment of the disclosure, and FIG. 6B is a back partial three-dimensional schematic view of the electronic device of the sixth embodiment of the disclosure. It is noted that the embodiment of FIG. 6A and FIG. 6B may respectively use the reference numerals and a part of the contents of the embodiment of FIG. 1A and FIG. 1B, and the same or similar reference numerals are used to denote the same or similar elements, and the description of the same technical content is omitted.

Referring to FIG. 6A and FIG. 6B at the same time, the main difference between an electronic device 10f of this embodiment and the aforementioned electronic device 10a is that a portion of the third surface 100s1 and the fourth surface 100s2 of the substrate 100 are not covered by the conductive pattern 500. In detail, the conductive pattern 500 in the electronic device 10f may include a conductive pattern 500a and a conductive pattern 500b. The conductive pattern 500a and the conductive pattern 500b are separated from each other to expose the uncovered third surface 100s1 and the fourth surface 100s2 of the substrate 100. The conductive pattern 500a is connected to one end of the reference voltage line RLb, and the conductive pattern 500b is connected to one end of the reference voltage line RLa.

Figure 7A:
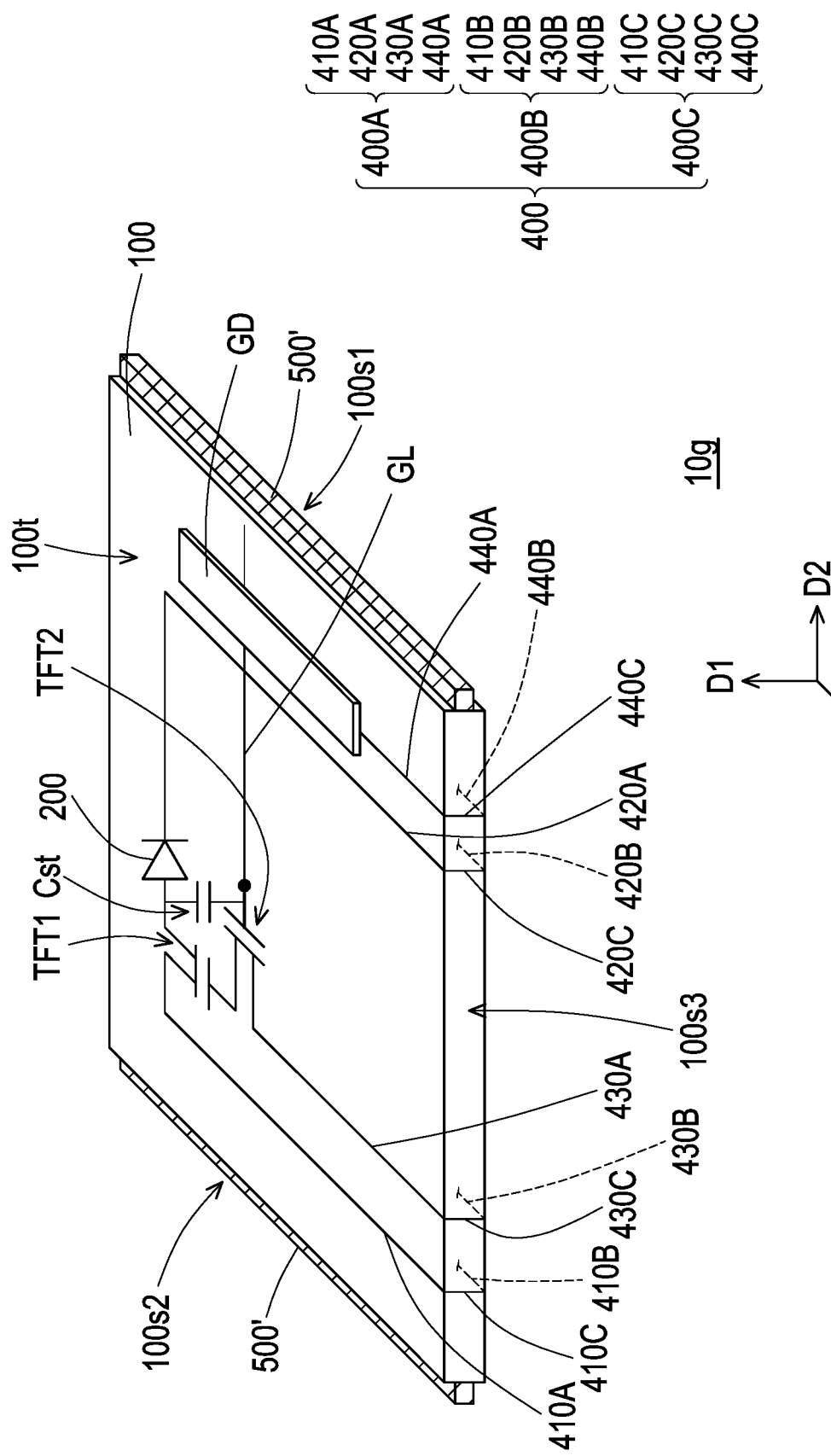
FIG. 7A and FIG. 7B are partial three-dimensional schematic views of an electronic device of the seventh embodiment of the disclosure.
Figure 7B:
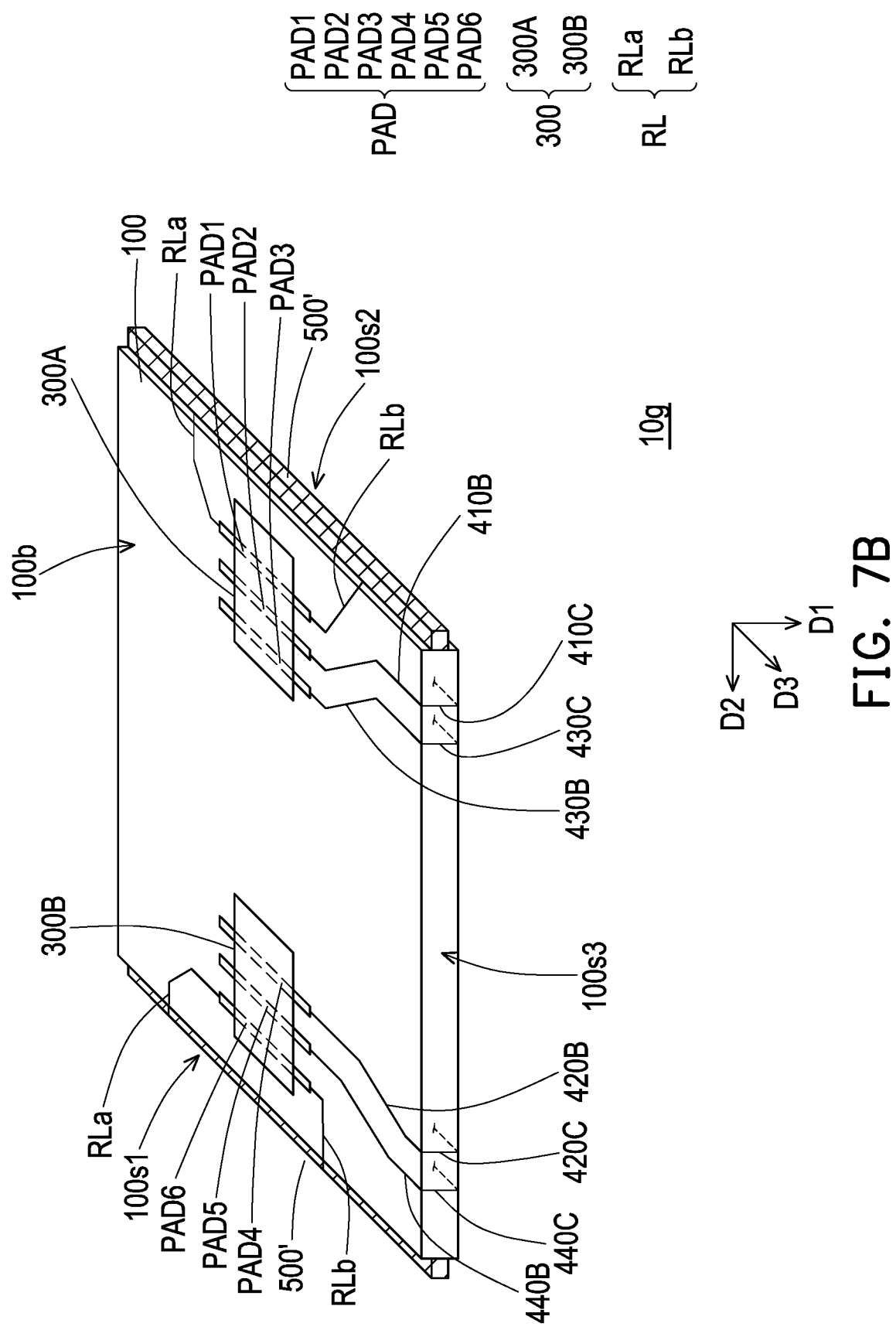

FIG. 7A and FIG. 7B are partial three-dimensional schematic views of an electronic device of the seventh embodiment of the disclosure. FIG. 7A is a front partial three-dimensional schematic view of the electronic device of the seventh embodiment of the disclosure, and FIG. 7B is a back partial three-dimensional schematic view of the electronic device of the seventh embodiment of the disclosure. It is noted that the embodiment of FIG. 7A and FIG. 7B may respectively use the reference numerals and a part of the contents of the embodiment of FIG. 1A and FIG. 1B, and the same or similar reference numerals are used to denote the same or similar elements, and the description of the same technical content is omitted.

Referring to FIG. 7A and FIG. 7B at the same time, the main difference between an electronic device 10g of this embodiment and the aforementioned electronic device 10a is that a portion of the third surface 100s1 and the fourth surface 100s2 of the substrate 100 are not covered by a conductive pattern 500'. In detail, the width of the conductive pattern 500' in the electronic device 10g in the first direction D1 is less than the width of the conductive pattern 500 of the electronic device 10a in the first direction D1, therefore, the conductive pattern 500' exposes a portion of the third surface 100s1 and the fourth surface 100s2 of the substrate 100.

It should be noted that the conductive patterns (the conductive pattern 500, the conductive pattern 500a, the conductive pattern 500b, and the conductive pattern 500') are not limited to those described in the foregoing embodiments.

According to the above, in the embodiment of this disclosure, the conductive pattern is disposed on at least one side surface of the substrate in the electronic device, which may provide a relatively low impedance current path, so that the static electricity accumulated at the edge of the electronic device may be dissipated through the current path, to achieve the role of electrostatic discharge protection. In addition, in the embodiment of this disclosure, an electrostatic discharge protection element or a grounding line is provided in the electronic device, so that the static electricity generated in the region where the electronic element is arranged in the electronic device may be discharged from this region through the electrostatic discharge protection element or the grounding line, so as to avoid electrostatic breakdown of electronic elements to achieve the role of electrostatic discharge protection.

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments can still be modified, or parts or all of the technical features thereof can be equivalently replaced; however, these modifications or substitutions do not deviate the essence of the corresponding technical solutions from the scope of the technical solutions of the embodiments of the disclosure. As long as the features of the various embodiments do not violate the spirit of the disclosure or conflict with one another, they can be mixed and matched arbitrarily.

What is claimed is:

1. An electronic device, comprising:
    a substrate, comprising a first surface, a second surface, and a third surface, wherein the first surface is opposite to the second surface, the third surface is located between the first surface and the second surface and connected to the first surface and the second surface;
    an electronic element, disposed on the first surface;
    a driving element, disposed on the second surface;
    a plurality of first traces, disposed on the first surface;
    a plurality of second traces, disposed on the second surface and electrically connected to the driving element, wherein the corresponding first traces are electrically connected to the corresponding second traces;
    a conductive pattern, disposed on the third surface and electrically connected to the driving element, wherein the conductive pattern receives a grounding voltage from the driving element or is floating; and
    an electrostatic discharge protection element, disposed on the first surface and electrically connected to the driving element,
    wherein a thickness of the conductive pattern is greater than or equal to 1 micron and less than or equal to 5 microns.

2. The electronic device according to claim 1, the substrate further comprising a fourth surface, wherein the fourth surface is opposite to the third surface and is connected to the first surface and the second surface, and the conductive pattern is also disposed on the fourth surface.

3. The electronic device according to claim 1, the substrate further comprising a fifth surface, wherein the fifth surface is adjacent to the third surface and is connected to the first surface and the second surface, wherein the corresponding first traces and the corresponding second traces are electrically connected to each other through a third trace disposed on the fifth surface.

4. The electronic device according to claim 1, the substrate further having a plurality of through holes, wherein the corresponding first traces and the corresponding second traces are electrically connected to each other through the through holes.

5. The electronic device according to claim 1, wherein the conductive pattern is formed by performing a laser process or a printing process.

6. The electronic device according to claim 1, wherein the conductive pattern exposes a portion of the third surface.

7. The electronic device according to claim 6, comprising a plurality of the conductive patterns, wherein the conductive patterns are separated from each other.

8. The electronic device according to claim 1, each of the first traces and each of the second traces comprising a first power supply line, wherein the first power supply line is electrically connected to the electronic element.

9. The electronic device according to claim 1, the first traces and the second traces each comprising a second power supply line, wherein the second power supply line is electrically connected to the electrostatic discharge protection element.

10. The electronic device according to claim 1, the first traces and the second traces each comprising a grounding line, wherein the grounding line is electrically connected to the conductive pattern through a reference voltage line.

11. An electronic device, comprising:
a substrate, comprising a first surface, a second surface, and a third surface, wherein the first surface is opposite to the second surface, the third surface is located between the first surface and the second surface and connected to the first surface and the second surface;
an electronic element, disposed on the first surface;
a driving element, disposed on the second surface;
a plurality of first traces, disposed on the first surface;
a plurality of second traces, disposed on the second surface and electrically connected to the driving element, wherein the corresponding first traces are electrically connected to the corresponding second traces; and
a conductive pattern, disposed on the third surface and electrically connected to the driving element, wherein the conductive pattern receives a grounding voltage from the driving element or is floating;
wherein at least one of the first traces and at least one of the second traces receive a grounding voltage from the driving element,
wherein a thickness of the conductive pattern is greater than or equal to 1 micron and less than or equal to 5 microns.

12. The electronic device according to claim 11, the substrate further comprising a fourth surface, wherein the fourth surface is opposite to the third surface and is connected to the first surface and the second surface, and the conductive pattern is also disposed on the fourth surface.

13. The electronic device according to claim 11, the substrate further comprising a fifth surface, wherein the fifth surface is adjacent to the third surface and is connected to the first surface and the second surface, wherein the corresponding first traces and the corresponding second traces are electrically connected to each other through a third trace disposed on the fifth surface.

14. The electronic device according to claim 11, the substrate further having a plurality of through holes, wherein the corresponding first traces and the corresponding second traces are electrically connected to each other through the through holes.

15. The electronic device according to claim 11, wherein the conductive pattern is formed by performing a laser process or a printing process.

16. The electronic device according to claim 11, wherein the conductive pattern exposes a portion of the third surface.

17. The electronic device according to claim 16, comprising a plurality of the conductive patterns, wherein the conductive patterns are separated from each other.

18. The electronic device according to claim 11, the first traces and the second traces each comprising a power supply line, a gate line, a data line, and a working signal line.

19. The electronic device according to claim 18, the first traces and the second traces each comprising a first transistor, a second transistor, and a gate driver, wherein the first transistor is electrically connected to the power supply line, the second transistor is electrically connected to the gate line and the data line, and the gate driver is electrically connected to the working signal line.

20. The electronic device according to claim 11, the first traces and the second traces each comprising a grounding line, wherein the grounding line is electrically connected to the conductive pattern through a reference voltage line.

* * * * *